United States Patent
Lee

(10) Patent No.: US 9,292,646 B2
(45) Date of Patent: Mar. 22, 2016

(54) INTEGRATED CIRCUIT DESIGN SYSTEM WITH BALANCED COLOR ASSIGNMENT

(71) Applicant: TAIWAN SEMICONDUCTOR MANUFACTURING COMPANY, LTD., Hsinchu (TW)

(72) Inventor: Hui Yu Lee, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/307,948

(22) Filed: Jun. 18, 2014

(65) Prior Publication Data

US 2015/0370945 A1    Dec. 24, 2015

(51) Int. Cl.
*G06F 17/50* (2006.01)

(52) U.S. Cl.
CPC .................... *G06F 17/5072* (2013.01)

(58) Field of Classification Search
CPC . G06F 17/5072; G06F 17/5081; G06F 17/50; G06F 17/5068; G06F 2217/12; G03F 7/70466; G03F 7/70433
USPC ...................... 716/50–56; 430/5, 30
See application file for complete search history.

(56) References Cited

U.S. PATENT DOCUMENTS

| | | | | |
|---|---|---|---|---|
| 8,473,874 B1 * | 6/2013 | Sharma et al. | ............... | 716/52 |
| 8,627,245 B1 * | 1/2014 | Banerjee et al. | ............... | 716/55 |
| 8,732,628 B1 * | 5/2014 | Wu et al. | ............... | 716/52 |
| 8,949,747 B1 * | 2/2015 | Wang | ............... | 716/54 |
| 9,026,958 B1 * | 5/2015 | Ghosh et al. | ............... | 716/55 |
| 2013/0086536 A1 * | 4/2013 | Kim et al. | ............... | 716/55 |
| 2014/0007026 A1 * | 1/2014 | Chen et al. | ............... | 716/55 |
| 2014/0223390 A1 * | 8/2014 | Sun et al. | ............... | 716/52 |

* cited by examiner

*Primary Examiner* — Nha Nguyen
(74) *Attorney, Agent, or Firm* — Hauptman Ham, LLP

(57) ABSTRACT

A method comprises grouping sub-components based on an association between the sub-components and connections coupled to the sub-components. The method also comprises determining a total ratio area per group based on normalized ratio units of the sub-components. The method further comprises identifying a priority group based on a ranking of the groups, the ranking being based on the total area per group. The method also comprises assigning, by a priority assignment process, a first color scheme or a second color scheme to the sub-components included in the priority group. The method further comprises assigning, by an other assignment process, the first color scheme or the second color scheme to the remainder of the sub-components. At least the other assignment process is based on a balancing of a first total area of sub-components having the first color scheme with a second total area of sub-components having the second color scheme.

20 Claims, 12 Drawing Sheets

| factor | Link | Ratio | Pre-color | SUM | Rank |
|---|---|---|---|---|---|
| VDD | M3:S | 1.2 | No | 2.4 | 4 |
| | M4:S | 1.2 | No | | |
| net10 | M1:D | 4.0 | No | 8 | 1 |
| | M3:D | 1.0 | No | | |
| | M3:G | 1.5 | No | | |
| | M4:G | 1.5 | No | | |
| net20 | M1:G | 4.0 | No | 4 | 3 |
| net30 | M2:G | 4.0 | No | 4 | 3 |
| net40 | M2:D | 4.0 | No | 5.2 | 2 |
| | M4:D | 1.2 | No | | |
| net80 | M1:S | 4.0 | No | 8 | 1 |
| | M2:S | 4.0 | No | | |

As $\boxed{\text{Ref} = M_3(A_D)}$ $$\text{Ratio}_{M4D} = \frac{M_4(A_D)}{\text{Ref}}$$

$$\text{Ratio}_{M4S} = \frac{M_4(A_S)}{\text{Ref}}$$

$$\text{Ratio}_{M4G} = \frac{M_4(A_G)}{\text{Ref}}$$

FIG. 8

INTEGRATED CIRCUIT DESIGN SYSTEM WITH BALANCED COLOR ASSIGNMENT

BACKGROUND

The recent trend in miniaturizing integrated circuits (ICs) has resulted in smaller devices that consume less power, yet provide more functionality at higher speeds. The miniaturization process has also resulted in stricter design and manufacturing tolerances. Pre-manufacture checking and testing are performed to make sure that a semiconductor device can be made and will function as designed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 8 is a diagram of a user interface including a weighting table, in accordance with one or more embodiments.

DETAILED DESCRIPTION

Figure 1:
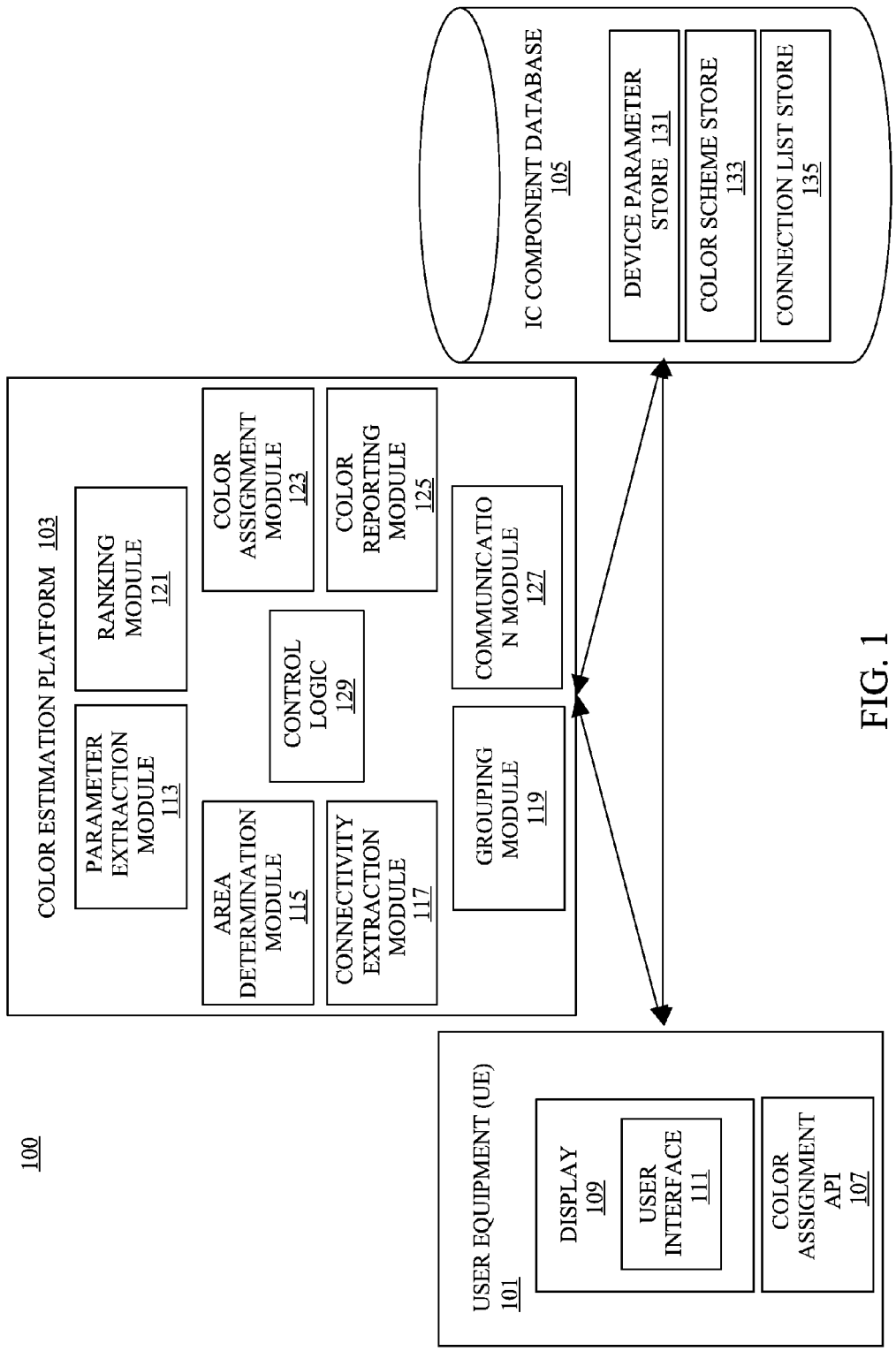
FIG. 1 is a diagram of an integrated circuit design system, in accordance with one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Techniques have been developed to represent integrated circuit designs at various levels of abstraction. According to these techniques, a designed integrated circuit is capable of being represented as a schematic or as a layout. A schematic diagram is an electronic diagram of a designed integrated circuit. Schematic diagrams often include symbols that represent circuit components such as transistors, resistors, capacitors, or other circuit components. Schematic diagrams also often include representations of the connections between the circuit components included in the schematic diagram. A layout is a representation of an integrated circuit in terms of planar geometric shapes that correspond to the patterns of materials such as metal, oxide, or semiconductor layers that make up the components of the integrated circuit.

The circuit components included in the schematic are commonly known as instances. The connections between the circuit components, or "wires" between the circuit components, are commonly known as nets. Schematic netlists are lists that include an inventory of the circuit components (i.e., instances) included in the schematic, and describe the circuit components and include attributes or properties of these circuit components. Schematic netlists also include an inventory of the connections between the circuit components (i.e., nets). Schematic netlists are sometimes stored as netlist files in databases accessible by electronic design automation (EDA) tools.

Integrated circuit designers often rapidly design and verify circuits, with extensive use of standard, reusable components and design flows. EDA tools allow designers to develop an integrated circuit design at the schematic level and verify performance at the schematic level via a pre-layout simulation. If the pre-layout simulation demonstrates that the integrated circuit design at the schematic level meets specified performance characteristics, EDA tools generate a layout and perform verification tasks such as design rule checks (DRC) and layout versus schematic (LVS) checks. Design rule checks compare the layout to a set of design rules that satisfy a series of recommended parameters set forth by an integrated circuit manufacturer to ensure that a manufactured integrated circuit functions properly.

Design rule sets specify certain geometric and connectivity restrictions to ensure sufficient margins to account for variability in the manufacturing process. LVS checks are often performed after the DRC is complete. EDA tools often perform LVS checks by extracting the circuit components and the connections between the circuit components and generating a layout netlist. The EDA tool then compares the layout netlist to the schematic netlist. If the layout netlist and the schematic netlist match within a specified tolerance or are identical, then the layout is "LVS clean."

After the layout passes the DRC and is "LVS clean," EDA tools often run a post-layout simulation to estimate overall circuit performance. EDA tools sometimes assign one or more color schemes to that represent at the layout stage whether a circuit component or sub-component is to be manufactured using one of a first mask or a second mask.

Usage of the first mask and the second mask is balanced as much as possible in the layout stage by a circuit designer. Color balancing in the layout stage is often difficult for a circuit designer, however. For example, certain design rules or design rule manuals that define color density rules, or a chemical mechanical polishing (CMP) requirement that affects how an integrated circuit is designed should be handled at the schematic stage of circuit design. But, these rules are often not accounted for until the layout stage, which makes passing the DRC and/or the post-layout simulation difficult, and makes color/mask assignment more difficult and time consuming.

For a designed integrated circuit to reach the post-layout simulation stage, a designer often goes through numerous iterations of schematic design, pre-simulation, layout generation, DRC, and/or LVS checks only to learn at the post-layout stage that the designed integrated circuit has a mask usage imbalance that when corrected is adverse to one or more of the design rules or other process requirements such as the CMP requirement, which renders the integrated circuit design undesirable. The designer then has to start over.

Some EDA tools make it possible for a designer to manually input mask usage and/or assign mask usage by color representation manually, which is error prone, inefficient, and does not balance the mask usage while taking various circuit component parameters, sizes, uses, materials, design rules, CMP requirements, or other factors into consideration. These difficulties and opportunities for error often result in a gap between the schematic and layout of the design integrated circuit, making the designer conduct multiple iterations of the design process from schematic to layout, which makes the integrated design process less efficient.

FIG. 1 is a diagram of an integrated circuit design system 100, in accordance with one or more embodiments. Integrated circuit design system 100 makes it possible for a designer to balance mask usage by way of color assignment at the design or schematic stage of designing an integrated circuit.

In FIG. 1, the integrated circuit design system 100 comprises user equipment (UE) 101 having connectivity to an integrated circuit (IC) design platform 103, and an IC component database 105.

The UE 101 is any type of mobile terminal, fixed terminal, or portable terminal including a desktop computer, laptop computer, notebook computer, netbook computer, tablet computer, wearable circuitry, mobile handset, or combination thereof. The UE 101 comprises a color assignment application programming interface (API) 107, a display 109 by which a user interface 111 is displayed. A user interacts with the IC design platform 103 using user interface 111 to design an IC, generate a schematic of the IC, simulate performance of the IC, and generate a layout of the IC.

The color estimation platform 103 is a set of computer readable instructions that, when executed by a processor, facilitates assigning a balanced color scheme to a designed integrated circuit. The color estimation platform 103 comprises a plurality of computing modules including a parameter extraction module 113, an area determination module 115, a connectivity extraction module 117, a grouping module 119, a ranking module 121, a color assignment module 123, a color reporting module 125, a communication module 127 by which the color estimation platform 103 communicates with the UE 101 and the IC component database 105, and a control logic 129 that governs communications between the various modules of the color estimation platform 103.

IC component database 105 is a memory capable of being queried by the color estimation platform 103 based on a user interaction with the user interface 111. The IC component database comprises a device parameter store 131, a color scheme store 133, and a connection list store 135.

The UE 101, color estimation platform 103, and IC component database 105 are together configured as a special purpose computer system. In some embodiments, one or more of the UE 101, color estimation platform 103, and IC component database 105 are unitarily embodied in the UE 101. The UE 101, accordingly, comprises a processor by which the color estimation platform 103 is executed. In some embodiments, one or more of the UE 101, color estimation platform 103 and IC component database 105 are configured to be located remotely from the each other. If located remotely, the color estimation platform 103 is executed by a processor that is also positioned remotely from the UE 101 such as another UE 101. By way of example, the UE 101, color estimation platform 103, and IC component database 105 communicate by wired or wireless communication connection and/or one or more networks such as a wired data network, a wireless network, a telephony network, or combination thereof.

Based on one or more user interactions with the user interface 111, an IC is designed or an instruction for color assignment is received, and the color estimation platform 103, by way of the color assignment module 123, assigns a balanced color scheme to the one or more circuit components and/or the one or more sub-components of the designed IC. The balanced color scheme involves balancing a total area of the designed IC occupied by the one or more circuit components and/or the one or more sub-components between assignment of a first color scheme or a second color scheme associated with usage of a first mask or a second mask, respectively, for manufacturing the designed IC. IC circuit components and/or sub-components comprise, for example, resistors, transistors, wires, capacitors, switches, nodes, interconnects, vias, gates, sources, drains, doped regions, channels, or other suitable circuit components or sub-components.

Figure 2:
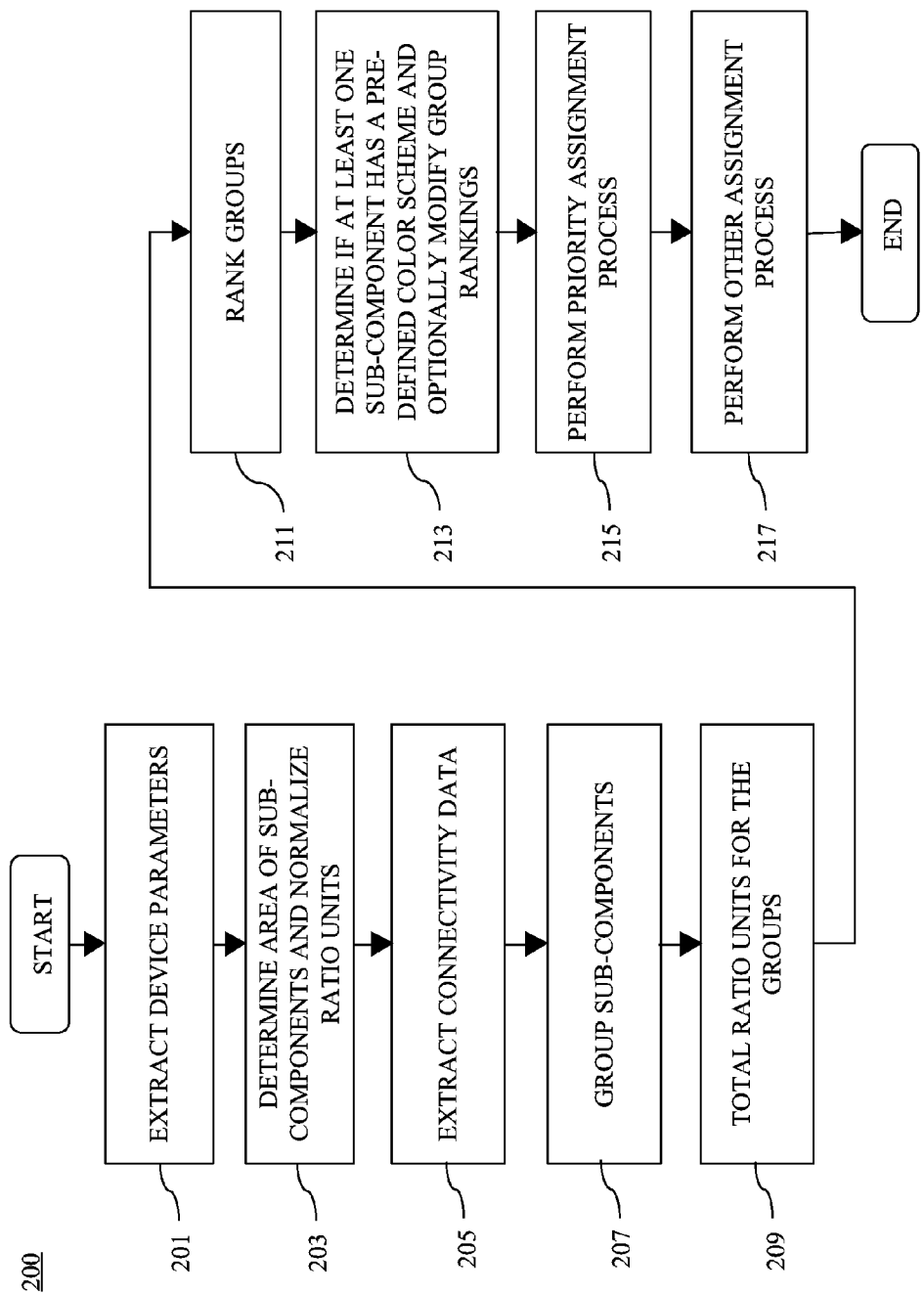
FIG. 2 is a flowchart of a method of assigning a balanced color scheme to a designed integrated circuit, in accordance with one or more embodiments.

FIG. 2 is a flowchart of a method 200 of assigning a balanced color scheme to a designed integrated circuit, in accordance with one or more embodiments.

Figure 12:
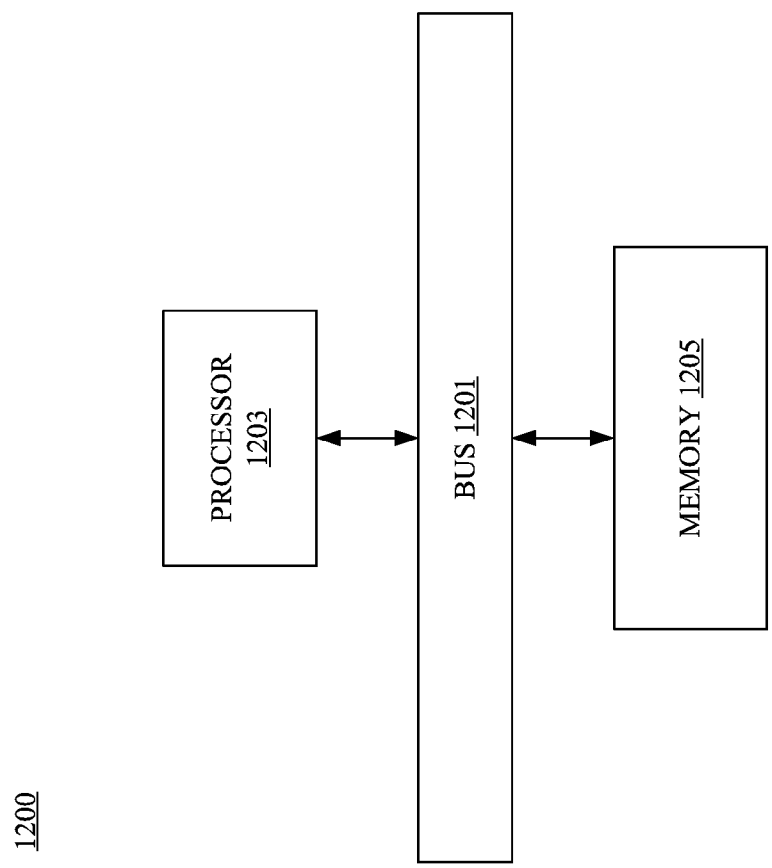
FIG. 12 is a functional block diagram of a computer or processor-based system upon which or by which an embodiment is implemented.

The method 200 is performed by a processor such as processor 1203 (FIG. 12). The processor executes computer-readable instruction such as color estimation platform 103 (FIG. 1), and any modules (FIG. 1) thereof, to assign a balanced color scheme to a designed IC. In step 201, color estimation platform 103, by way of the parameter extraction module 113 processes a design, schematic or netlist of a designed IC, and extracts device parameters comprising a length and a width of one or more sub-components of one or more circuit components of the designed IC. In some embodiments, the device parameters further comprise a quantity of a defined type of sub-component such as the sub-component being one of a source, a drain, or a gate.

In step 203, the color estimation platform 103 determines, by way of the area determination module 115, areas of coverage associated with the one or more sub-components of the designed IC based on the device parameters. The color estimation platform 103 then, by way of the area determination module 115, normalizes the determined areas of the one or more sub-components into normalized ratio units. The normalized ratio units are determined based on ratios of the determined areas of the one or more sub-components to a smallest determined area of the one or more sub-components.

The one or more sub-components are coupled to one or more connections (e.g., wires or nets). In step 205, the color estimation platform 103, by way of the connectivity extraction module 117, extracts connectivity data indicating an association between the one or more sub-components and the one or more connections by, for example, processing the design, schematic or netlist of the designed IC, and extracting information indicating the one or more connections that couple the one or more sub-components.

In step 207, the color estimation platform 103, by way of the grouping module 119, groups the one or more sub-components into one or more groups based on the association between the one or more sub-components and the one or more connections.

In step 209, the color estimation platform 103, by way of the grouping module 119, totals the ratio units of the sub-components included in the one or more groups to yield a total ratio area per group of the one or more groups.

In step 211, the color estimation platform 103, by way of the ranking module 121, ranks the total area per group and identifies one or more of the one or more groups as a priority group based on a ranking of the one or more groups.

In step 213, the color estimation platform 103, by way of the ranking module 121, determines if the designed IC or at least one of one or more sub-components has a pre-defined color scheme assigned to one or more of the one or more sub-components. If the color estimation platform 103 determines that at least one of the one or more sub-components does have a pre-defined color scheme, then the color estimation platform 103, by way of the ranking module 121, modified the group rankings, or re-ranks, the one or more groups based on the pre-determined color scheme assignment of at least one of the one or more sub-components. The re-ranking causes one or more of the ranked groups to be newly identified as the priority group. The re-ranking also causes the ranking of the one or more groups to be changed based on the newly identified priority group. For example, if a group is ranked as "1" indicating that the group is the priority group and a different group is ranked as "4," the different group is determined to have a pre-defined color scheme assignment, the different group is newly identified as the priority group, the ranking of the different group is re-ranked to be "1," and the ranking of the group previously having a ranking of "1" is re-ranked to be "2."

In step 215, the color estimation platform 103, by way of the color assignment module 123, performs a priority assignment process that assigns a first color scheme or a second color scheme to the one or more sub-components included in the priority group. The first color scheme is different from the second color scheme. For example, if the first color scheme is red, the second color scheme is green. In some embodiments, the assigned first color scheme and second color scheme are different colors, different patterns, a combination of different colors and different patterns, or other suitable differentiator capable of distinguishing the first color scheme from the second color scheme via UE 101 (FIG. 1).

In step 217, the color estimation platform 103, by way of the color assignment module 123, performs an other assignment process that assigns one of the first color scheme or the second color scheme to the one or more sub-components that are other than, or excluded from, the one or more sub-components included in the priority group. In some embodiments, the other assignment process is performed after the priority assignment process. In some embodiments, if at least one of the one or more sub-components is determined to have a pre-defined color scheme, the priority assignment process is associated with the newly identified priority group and the other assignment process is associated with the one or more sub-components other than the one or more sub-components included in the newly identified priority group. In some embodiments, the other assignment process assigns the first color scheme or the second color scheme to the one or more sub-components other than the one or more sub-components included in the priority group based on the ranking order of the remaining groups as opposed to assigning color schemes to all of the remaining sub-components as massive group. In some embodiments, the color scheme assigned to the one or more sub-components included in the priority group are fixed after performing the priority assignment process. In other embodiments, the color scheme assigned to the one or more sub-components included in the priority group are capable of being selectively altered by way of a user interaction with user interface 111 (FIG. 1).

At least the other assignment process is based on a balancing of a first total area of sub-components having the first color scheme with a second total area of sub-components having the second color scheme. The first color scheme is associated with a first mask and the second color scheme is associated with a second mask. The first mask and the second mask are used in manufacturing of the designed IC, and the first color scheme and the second color scheme serve as a set of manufacturing instructions or as a way to check if a designed IC is in compliance with one or more design rules associated with mask usage, for example. As such, one or more of the priority assignment process or the other assignment process takes one or more design rules into consideration. In some embodiments, the one or more design rules restrict use of one of the first mask or the second mask for generation of one or more of the one or more sub-components associated with the one or more design rules.

In some embodiments, the balancing of the first total area of sub-components having the first color scheme with the second total area of sub-components having the second color scheme is within a predetermined tolerance of the first total area of sub-components having the first color scheme being equal to the second total area of sub-components having the second color scheme. An even balancing of the first total area of sub-components having the first color scheme with the second total area of sub-component having the second color scheme would be 50:50 or 50% first color scheme and 50% second color scheme, and a predetermined tolerance of 0%. But, in some embodiments, a perfect balancing is not possible, accordingly, the color estimation platform 103 is capable of being set to balance the first total area of sub-components having the first color scheme to the second total area of sub-components having the second color scheme within a predetermined tolerance of about 2.5%, about 5%, about 7.5%, about 10%, or a different customizable tolerance suitable for a designed IC. For example, in some embodiments, if the predetermined tolerance is about 5%, the color estimation platform 103 has the capability of assigning the color schemes such that the first total area of sub-components having the first color scheme makes up about 52.5% of the total area of the sub-components and the second total area of sub-components having the second color scheme makes up about 47.5% of the total area of the sub-components.

In some embodiments, one or more of the priority assignment process or the other assignment process comprises dividing, by the color estimation platform 103, the normalized ratio units into a quantity of tokens that represent the total ratio units of each of the one or more groups. One of the first color scheme or the second color scheme is assigned by the color estimation platform 103 to a selected sub-component included in a selected group by assigning the first color scheme or the second color scheme to the selected sub-component based on a user interaction received by way of user interface 111. The user interaction, for example, involves dropping, or otherwise manipulating a control or providing instructions to cause, a quantity of tokens representative of the total ratio unit area of the selected sub-component into a first color scheme bucket or a second color scheme bucket by way of the user interface 111.

Figure 3:
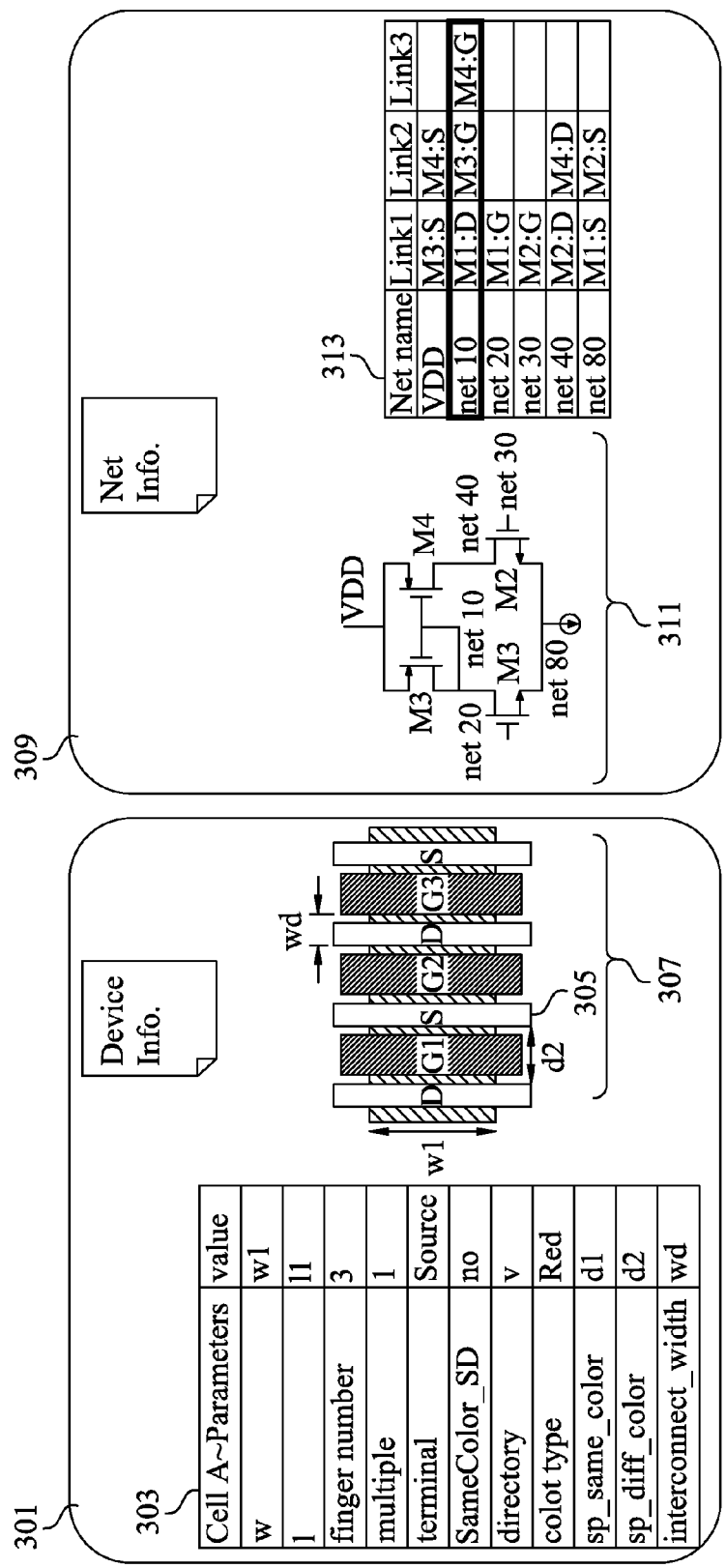
FIG. 3 is a diagram of user interfaces associated with extracting device parameters, in accordance with one or more embodiments.

FIG. 3 is a diagram of user interfaces associated with extracting device parameters, in accordance with one or more embodiments.

User interface 301 is accessible by way of user interface 111 (FIG. 1) and includes a parameter table 303 that has a list of device parameters associated with a selected sub-component 305 of a circuit component 307 of a designed IC. User interface 309 is accessible by way of user interface 111 and includes a schematic 311 of the designed IC and a connection list 313.

The device parameters included in the parameter table 303 include, for example, a length, a width, a finger number, a multiple or quantity of selected sub-components, a terminal or sub-component type, a color scheme assignment, and other device parameters that describe the selected sub-component.

The connection list 313 includes a list of connections or nets, and the sub-components linked to the connections. As such, the connection list 313 is a representation of the groups assembled by the color estimation platform 103 (FIG. 1) based on the extracted connectivity data. The connections included in the list of connections 313 are extracted from the schematic 311 by the color estimation platform 103.

In some embodiments, alternatively or in addition to extracting the device parameters and/or the connectivity data from the schematic, the color estimation platform 103 is configured to extract or be supplied with the device parameters and/or the connectivity data, in addition to the one or more design rules, electrical or material information, or other suitable information from a PDK, or by way of user input via user interface 111.

Figure 4:
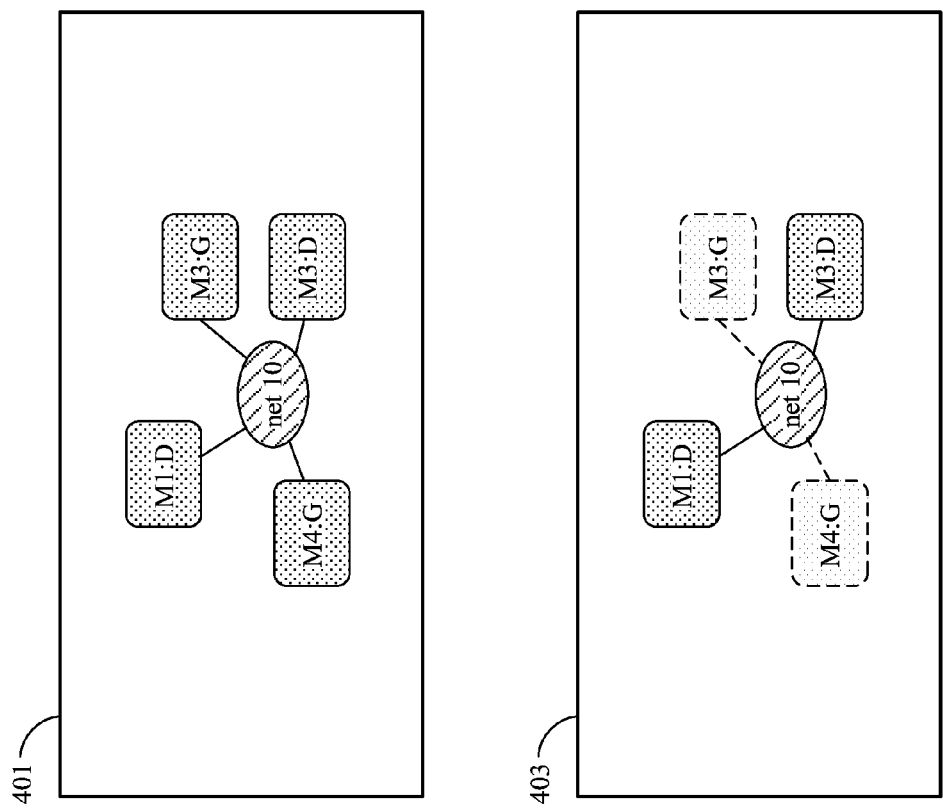
FIG. 4 is a diagram of user interfaces that include a graphical representation of a group of sub-components, in accordance with one or more embodiments.

FIG. 4 is a diagram of user interfaces that include a graphical representation of a group of sub-components, in accordance with one or more embodiments.

User interface 401 is accessible by way of user interface 111 (FIG. 1) and includes a graphical representation of sub-components M1:D, M3:G, M4:G, and M3:D associated with connection net 10. M1:D, for example, is indicative of a drain of a circuit component M1, is has connectivity to M3:G is indicative of a gate of a circuit component M3, M4:G is indicative of a gate of a circuit component M4, and M3:D is indicative of a drain of a circuit component M3.

User interface 403 indicates that a user has selected drains M1:D and M3:D for color scheme assignment by way of a user interaction with user interface 111.

Figure 5:
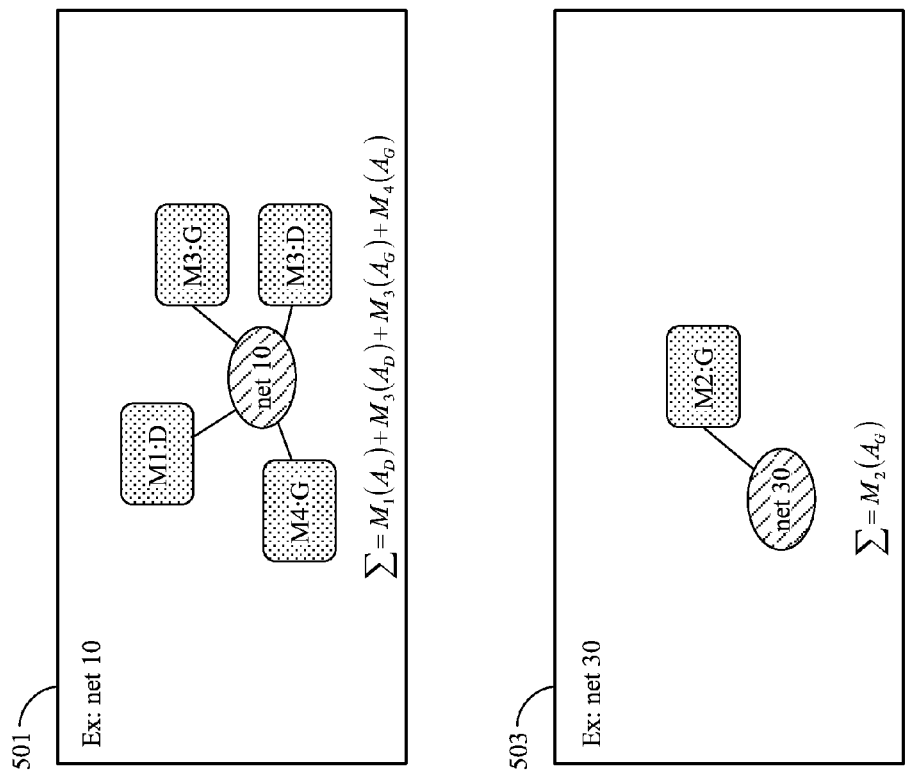
FIG. 5 is a diagram of example solutions for determining a total area of sub-components included in a group, in accordance with one or more embodiments.

FIG. 5 is a diagram of example solutions for determining a total area of sub-components included in a group, in accordance with one or more embodiments.

In some embodiments, the color estimation platform 103 (FIG. 1) determines the area of a drain-type sub-component using:

$$M_x(A_D) = (\text{fingerNumber} - 1) \times (w \times w_d) \quad (1)$$

The color estimation platform 103 determines the area of a source-type sub-component using:

$$M_x(A_S) = (\text{fingerNumber} - 1) \times (w \times w_d) \quad (2)$$

The color estimation platform 103 determines the area of a gate-type sub-component using:

$$M_x(A_G) = \text{fingerNumber} \times (w \times l) \quad (3)$$

To determine the total area of sub-components included in a group, the color estimation platform 103 adds the area of all of the sub-components included in the group together. This summation is because the color estimation platform 103 bases the assignment of the first color scheme or the second color scheme to the one or more sub-components of the designed IC on the physical dimension of each circuit component's terminals, as well as the connectivity relationships between sub-components. If a connection has connectivity to more than one terminal (or sub-component), then all of the sub-components connected are taken into consideration by the color estimation platform 103.

Example area solution 501 is a graphical depiction of a total sub-component area of net 10. Example area solution 503 is a graphical depiction of a total sub-component area of net 30. Net 10 and net 30 are included in connection list 313 (FIG. 3).

Figure 6:
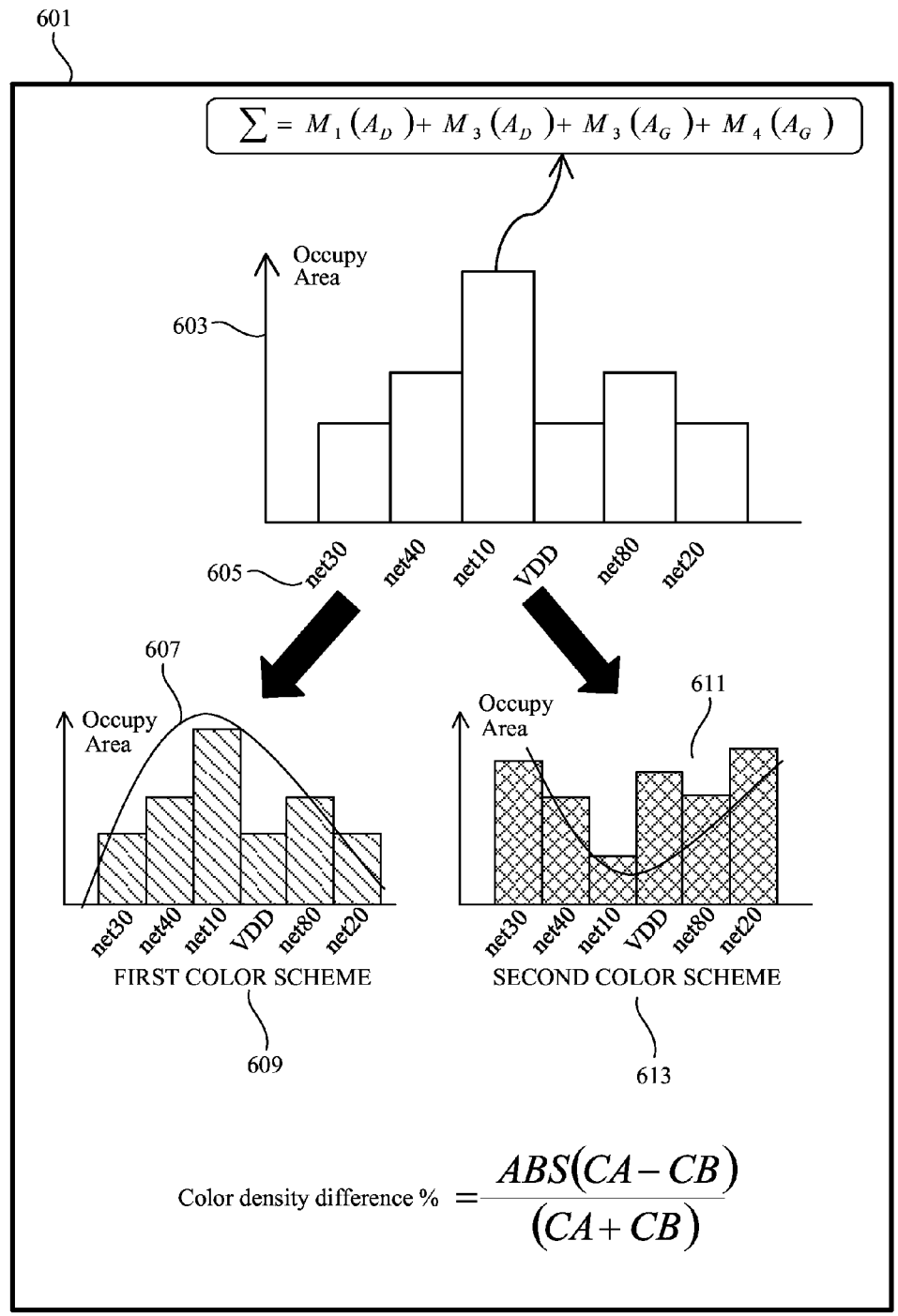
FIG. 6 is a user interface of a graph analysis of a color scheme distribution, in accordance with one or more embodiments.

FIG. 6 is a user interface of a graph analysis of a color scheme distribution, in accordance with one or more embodiments.

User interface 601 includes an area chart 603 of the total area of groups 605 compared to one another. Chart 607 is a graph of the total area of sub-components in each of the groups 605 that are assigned the first color scheme 609. Chart 611 is a graph of the total area of sub-components in each of the groups 605 that are assigned the second color scheme 613.

In some embodiments, user interface 601 includes a color density report generated by the color estimation platform 103 (FIG. 1). For example, a color density difference, in some embodiments, is defined by:

$$\text{Color density difference \%} = \frac{\text{ABS}(CA - CB)}{(CA + CB)} \quad (4)$$

where ABS(CA-CB) is the absolute value of the area occupied by the sub-components assigned the first color scheme minus the area occupied by the sub-components assigned the second color scheme and (CA+CB) is the total area of sub-components having the first color scheme and the second color scheme. In some embodiments, the color density difference is predefined to be within a selected tolerance of 0% or the area of sub-components having the first color scheme being equal to the area of sub-components having the second color scheme.

Figure 7:
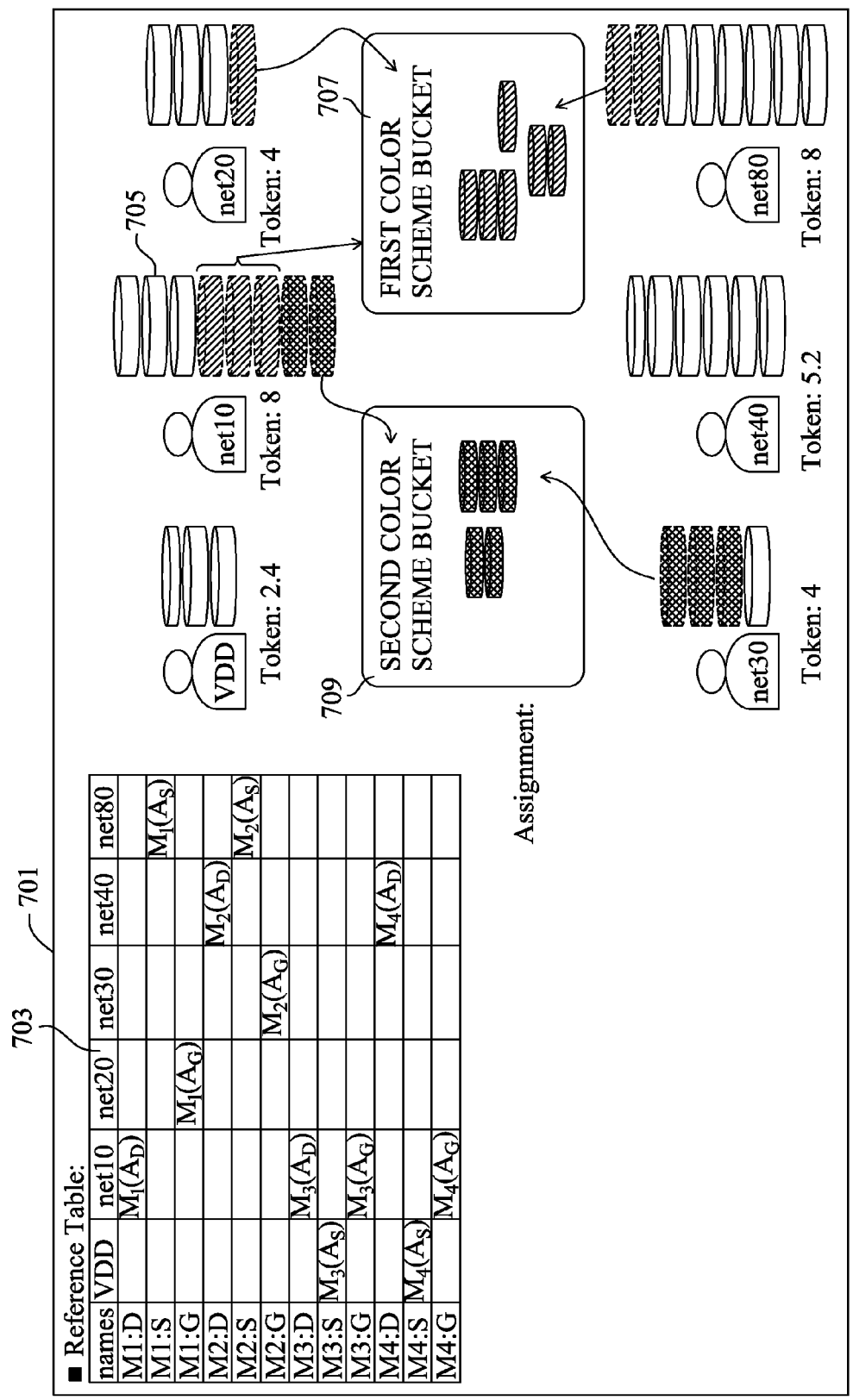
FIG. 7 is a diagram of a user interface of an assignment process performed by a token deposition method, in accordance with one or more embodiments.

FIG. 7 is a diagram of a user interface of an assignment process performed by a token deposition method, in accordance with one or more embodiments.

User interface 701 is accessible by way of user interface 111 (FIG. 1) and includes a reference table 703 of the sub-components included in the designed IC and the groups that are formed based on the extracted connectivity data. Reference table 703 also includes the areas of all of the sub-components. In some embodiments, one or more of the priority assignment process or the other assignment process comprises dividing normalized area ratio units into a quantity of tokens 705 that represent the total ratio units of each of the one or more groups. For example, the areas of the sub-components included in the reference table 703 are divided by a smallest sub-component area to yield a normalized ratio unit. The total areas of net 10, for example, is 8.0 normalized ratio units. Net 10, therefore, has 8.0 tokens available for color scheme assignment. In a color balancing process, a user selects a quantity of tokens 703 from a selected group and drops the quantity of tokens into one of a first color scheme bucket 707 or a second color scheme bucket 709. As tokens 705 are dropped into color scheme buckets 707 or 709, the quantity of remaining tokens for a selected group reduces. In some embodiments, all some or all of the tokens 705 associated with a selected group are associated with the first color scheme or the second color scheme. If a quantity of tokens 705 greater than the quantity of tokens 705 assigned to the first color scheme, for example, is dropped into the first color scheme bucket 707, then the quantity of tokens 705 assigned to the second color scheme will be reduced. Based on a distribution of tokens 705, the color estimation platform 103 (FIG. 1) assigns the first color scheme or the second color scheme to sub-components of the group and distributes the first color scheme and the second color scheme among the subcomponents of the groups bases on the distribution of tokens 705 per group per color scheme bucket 707, 709.

In some embodiments, the sub-components of the groups are individually selectable, and individually have tokens 705 assigned within each of the groups. The tokens 705 are dropped into the first color scheme bucket 707 or the second color scheme bucket 709 based on a selection of one or more sub-components within a selected group.

FIG. 8 is a diagram of a user interface including a weighting table, in accordance with one or more embodiments.

User interface 801 is accessible by way of user interface 111 (FIG. 1). User interface 801 includes weighting table 803. Weighting table 803 includes a listing of groups, organized by connected sub-component based on the connectivity data extracted by the color estimation platform 103 (FIG. 1). The weighting table includes normalized ratio units for each of the sub-components included in each group and a sum-total of the normalized area units for each group. The groups included in the weighting table are ranked by the color estimation platform 103 based in order of greatest area. None of the groups in the weighting table 803 are assigned a pre-defined color scheme. As such, the rankings are in order of greatest area to least greatest area. For example, net 10 and net 80 have the greatest total area occupied by the sub-components within the groups net 10 and net 80. Groups net 10 and net 80, therefore, are ranked "1" and are accordingly designated as the priority group by the color estimation platform 103.

In weighting table 803, the color estimation platform 103 identified sub-component M3:D as the reference component for normalizing the ratio units of the areas for each of the sub-components, because M3:D had the smallest area. Accordingly, the normalized ratio unit for M3:D is 1.0. The sum total of group net 10 is 8.0. Accordingly, the sum total of group net 10 is 8.0 times the area of M3:D.

Figure 9:
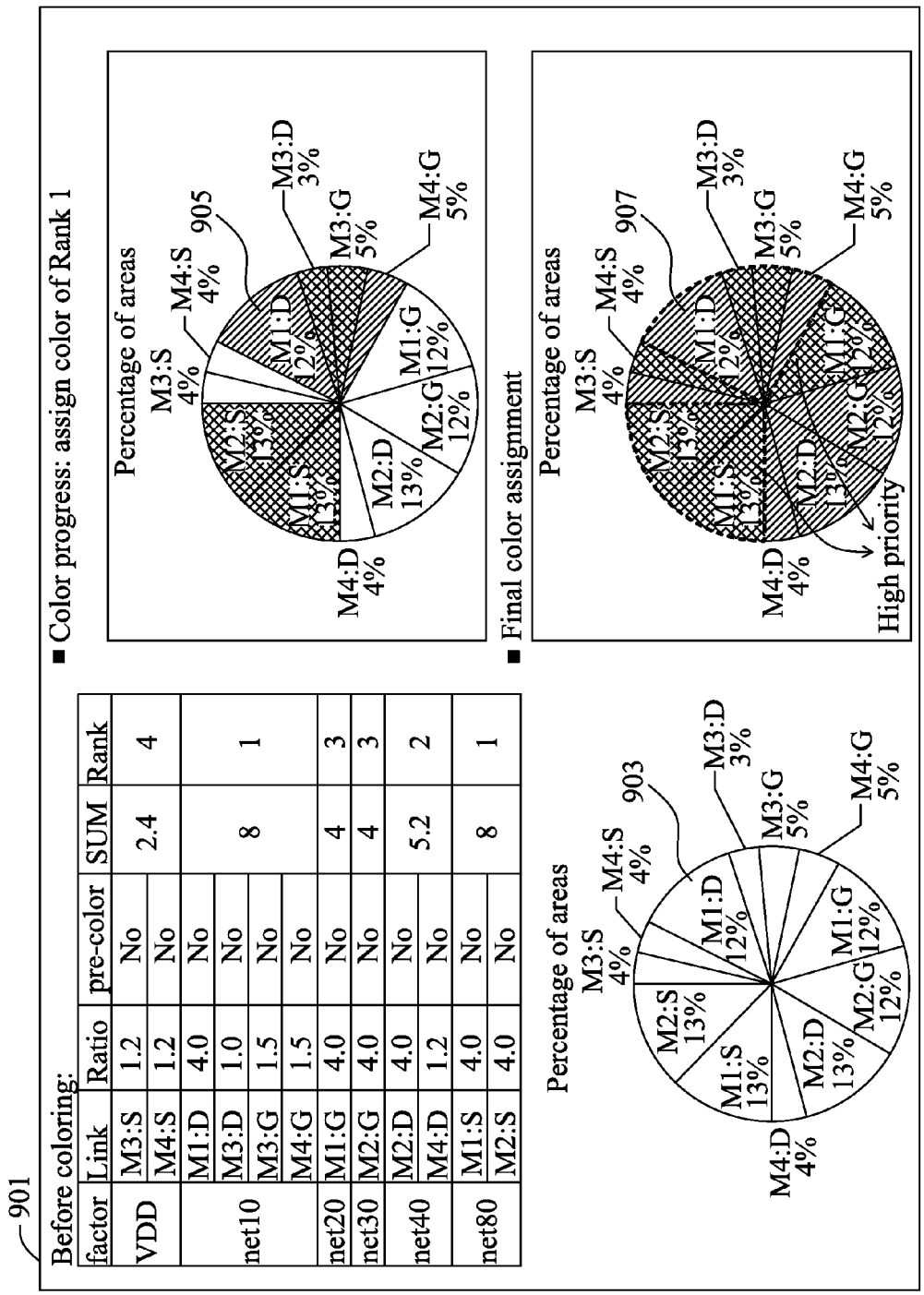
FIG. 9 is a diagram of a user interface for assigning the first color scheme and the second color scheme, in accordance with one or more embodiments.

FIG. 9 is a diagram of a user interface for assigning the first color scheme and the second color scheme, in accordance with one or more embodiments.

User interface 901 is accessible by way of user interface 111 (FIG. 1) and includes weighting table 803 (FIG. 8), area percentage chart 903, priority assignment process chart 905, and other assignment process chart 907. The color estimation platform 103 (FIG. 1) determines the percentages of area occupied by the one or more sub-components of the designed IC. Based on the ranking, the color estimation platform 103 performs the priority assignment process that assigns the first color scheme or the second color scheme to the sub-components included in the priority group. For example, net 10 and net 80 were designated as being the priority group, because the color estimation platform 103 determined net 10 and net 80 had rankings of "1." Based on one or more of a token assignment process, other user interaction, or an automated process, the color estimation platform 103 assigned the first color scheme to sub-components M1:D and M4:G. The color estimation platform 103 also assigned the second color scheme to sub-components M1:S, M2:S, M3:D, and M3:G. The color assignment progress at completion of or during the priority assignment process is shown in priority assignment process chart 905. Upon completion of the priority assignment process, the color estimation platform 103 performs the other assignment process and assigns one of the first color scheme or the second color scheme to the remaining sub-components M3:S, M4:S, M4:D, M1:G, M2:G and M2:D that are not included in the identified priority group. The color estimation platform 103 assigned the first color scheme to M3:S, M4:D, M2:G and M2:D. The color estimation platform 103 also assigned the second color scheme to M4:S and M1:G.

Figure 10:
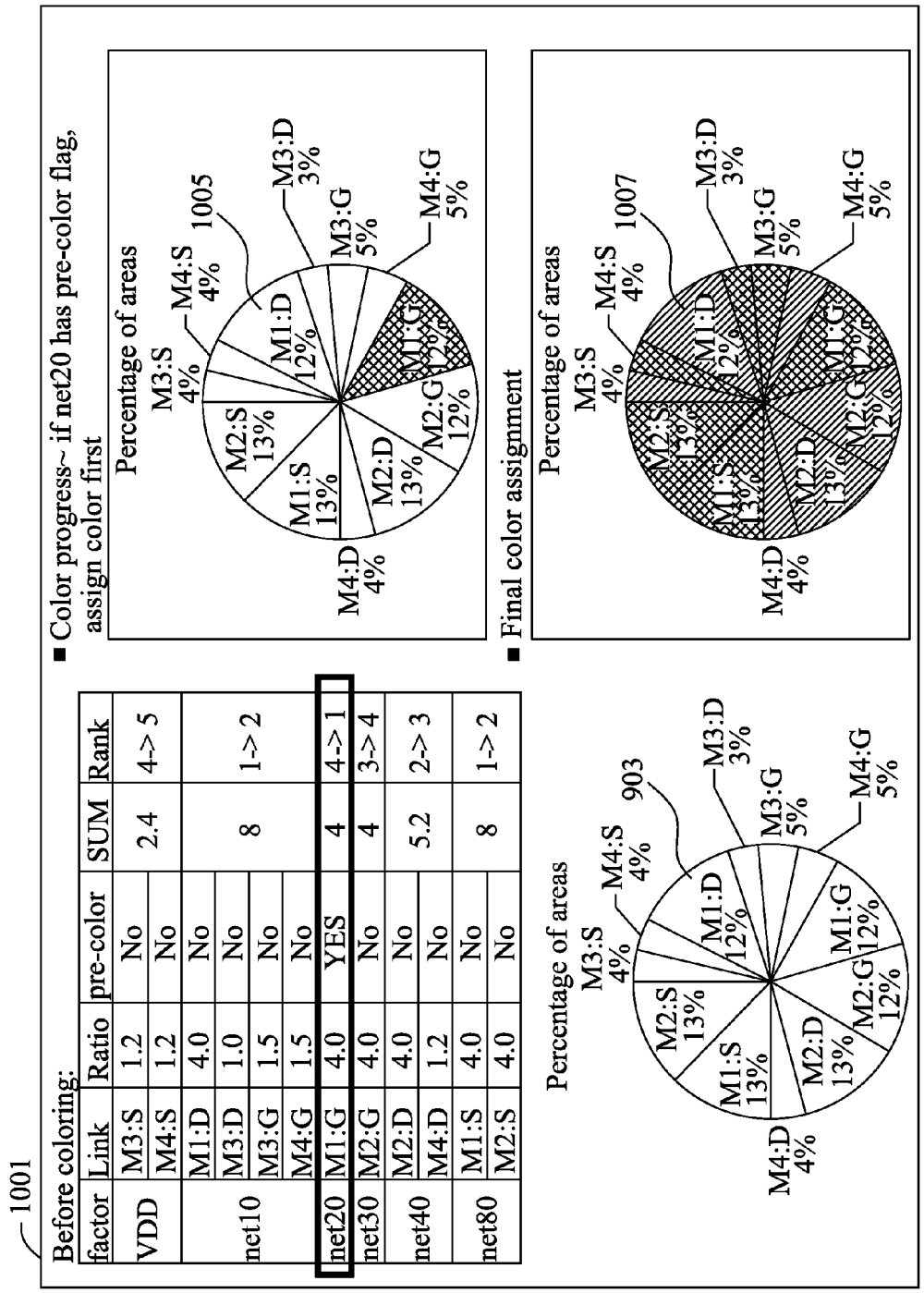
FIG. 10 is a diagram of a user interface for assigning the first color scheme and the second color scheme, in accordance with one or more embodiments.

FIG. 10 is a diagram of a user interface for assigning the first color scheme and the second color scheme, in accordance with one or more embodiments.

User interface 1001 is accessible by way of user interface 111 (FIG. 1) and includes the same features as user interface 901 with the reference numerals increased by 100. User interface 1001 is an example in which one of the sub-components, M1:G, has a pre-defined color scheme. M1:G is predefined as having the first color scheme. Accordingly, group net 20 is identified as the primary group and ranked by the color estimation platform 103 as having a ranking of "1." Groups net 10 and net 80 are re-ranked by the color estimation platform 103 to have a ranking of "2" and are no longer the primary group. The color estimation platform 103 performs the priority assignment process on net 20, and assigned the second color scheme to sub-component M1:G, as indicated in priority assignment process chart 1005. The other groups, and corresponding sub-components are re-ranked to reflect the newly identified primary group, net 20, and the color estimation platform 103 performed the other assignment process on the other sub-components after completion of the priority assignment process, as indicated in other assignment process chart 1007.

Figure 11:
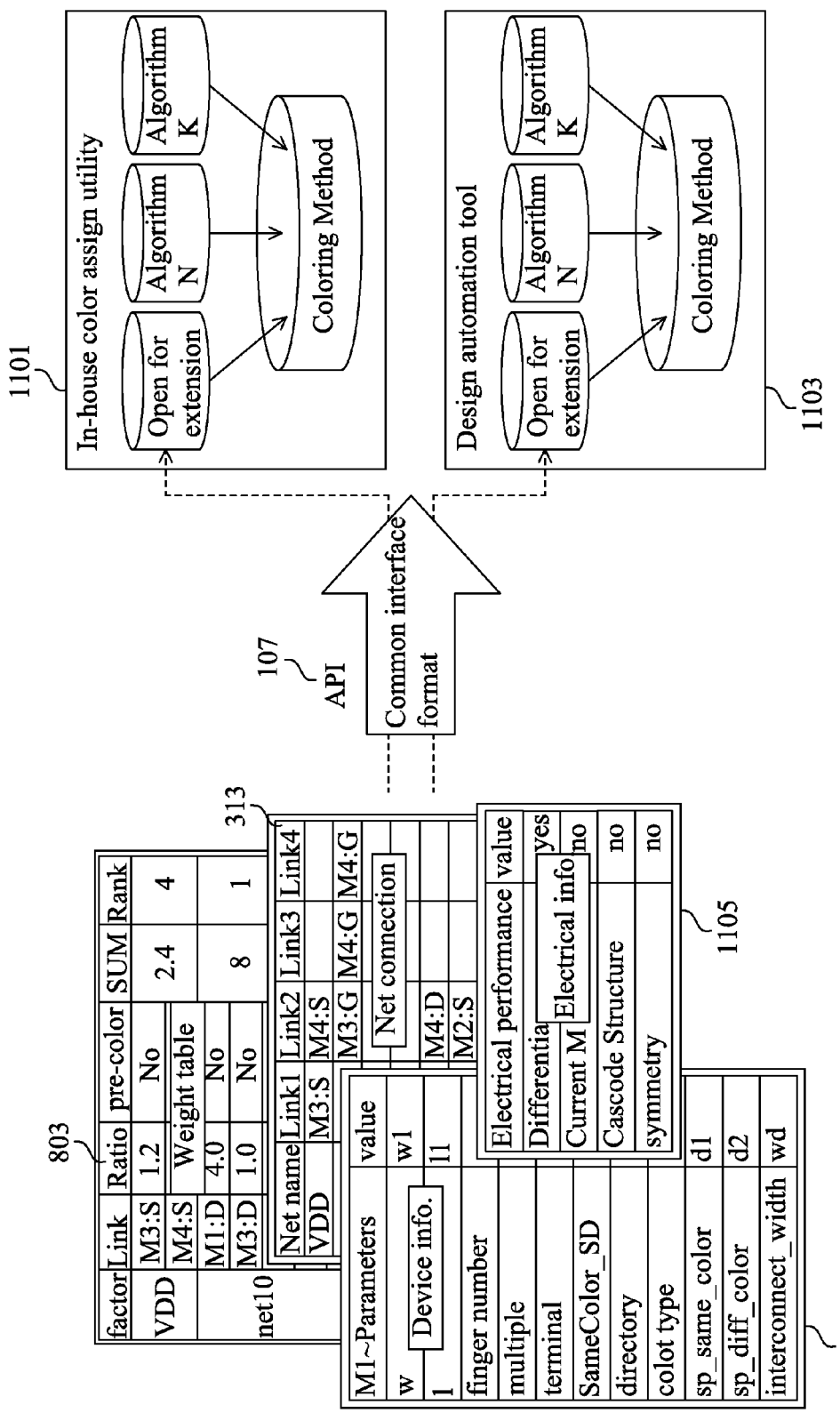
FIG. 11 is a diagram of optional interfaces for the color estimation platform, in accordance with one or more embodiments.

FIG. 11 is a diagram of optional interfaces for the color estimation platform, in accordance with one or more embodiments.

API 107 is selectively configurable to interface with a UE 101 (FIG. 1) that is configured as an in-house or foundry color assignment tool 1101, or an EDA tool 1103. The color estimation platform 103 (FIG. 1) is configured to output the device parameter table 303, the connection list 313, the weighting table 803 and an electrical information table 1105 in a format that the API 107 is capable of receiving and communicating the outputs of the color estimation platform 103 to the color assignment tool 1103 or the EDA tool 1103 Define common definition of device info. The API 107 defines generates a common definition of the device parameters, the connectivity data, the rankings and the electrical data included in the electrical information table 1105. The API 107 also defines a specific interface for color handling. In some embodiments, the API 107 supplied the outputs of the color estimation platform 103 as a binary file, a text file, a coloring table, or other suitable format. Accordingly, the API 107 is capable of bringing a color weight table into an in-house utility and design automation tool as one of a color assigned reference, or supporting different EDA programs and/or computer-readable language.

The processes described herein for assigning a balanced color scheme to a designed integrated circuit may be advantageously implemented via software in combination with hardware or firmware, hardware, firmware or a combination of software and firmware and/or hardware. For example, the processes described herein, may be advantageously implemented via a processor, Digital Signal Processing (DSP) chip, an Application Specific Integrated Circuit (ASIC), Field Programmable Gate Arrays FPGAs, etc. Such exemplary hardware for performing the described functions is detailed below.

FIG. 12 is a functional block diagram of a computer or processor-based system 1200 upon which or by which an embodiment is implemented.

Processor-based system 1200 is programmed to assign a balanced color scheme to a designed integrated circuit, as described herein, and includes, for example, bus 1201, processor 1203, and memory 1205 components.

In some embodiments, the processor-based system is implemented as a single "system on a chip." Processor-based system 1200, or a portion thereof, constitutes a mechanism for performing one or more steps of assigning a balanced color scheme to a designed integrated circuit.

In some embodiments, the processor-based system 1200 includes a communication mechanism such as bus 1201 for transferring information and/or instructions among the components of the processor-based system 1200. Processor 1203 is connected to the bus 1201 to obtain instructions for execution and process information stored in, for example, the memory 1205. In some embodiments, the processor 1203 is also accompanied with one or more specialized components to perform certain processing functions and tasks such as one or more digital signal processors (DSP), or one or more application-specific integrated circuits (ASIC). A DSP typically is configured to process real-world signals (e.g., sound) in real time independently of the processor 1203. Similarly, an ASIC is configurable to perform specialized functions not easily performed by a more general purpose processor. Other specialized components to aid in performing the functions described herein optionally include one or more field programmable gate arrays (FPGA), one or more controllers, or one or more other special-purpose computer chips.

In one or more embodiments, the processor (or multiple processors) 1203 performs a set of operations on information as specified by a set of instructions stored in memory 1205 related to assigning a balanced color scheme to a designed integrated circuit. The execution of the instructions causes the processor to perform specified functions.

The processor 1203 and accompanying components are connected to the memory 1205 via the bus 1201. The memory 1205 includes one or more of dynamic memory (e.g., RAM, magnetic disk, writable optical disk, etc.) and static memory (e.g., ROM, CD-ROM, etc.) for storing executable instructions that when executed perform the steps described herein to assign a balanced color scheme to a designed integrated circuit. The memory 1205 also stores the data associated with or generated by the execution of the steps.

In one or more embodiments, the memory 1205, such as a random access memory (RAM) or any other dynamic storage device, stores information including processor instructions for assigning a balanced color scheme to a designed integrated circuit. Dynamic memory allows information stored therein to be changed by system 100. RAM allows a unit of information stored at a location called a memory address to be stored and retrieved independently of information at neighboring addresses. The memory 1205 is also used by the processor 1203 to store temporary values during execution of processor instructions. In various embodiments, the memory 1205 is a read only memory (ROM) or any other static storage device coupled to the bus 1201 for storing static information, including instructions, that is not changed by the system 100. Some memory is composed of volatile storage that loses the information stored thereon when power is lost. In some embodiments, the memory 1205 is a non-volatile (persistent) storage device, such as a magnetic disk, optical disk or flash card, for storing information, including instructions, that persists even when the system 100 is turned off or otherwise loses power.

The term "computer-readable medium" as used herein refers to any medium that participates in providing information to processor 1203, including instructions for execution. Such a medium takes many forms, including, but not limited to computer-readable storage medium (e.g., non-volatile media, volatile media). Non-volatile media includes, for example, optical or magnetic disks. Volatile media include, for example, dynamic memory. Common forms of computer-readable media include, for example, a floppy disk, a flexible disk, a hard disk, a magnetic tape, another magnetic medium, a CD-ROM, CDRW, DVD, another optical medium, punch cards, paper tape, optical mark sheets, another physical medium with patterns of holes or other optically recognizable indicia, a RAM, a PROM, an EPROM, a FLASH-EPROM, an EEPROM, a flash memory, another memory chip or cartridge, or another medium from which a computer can read. The term computer-readable storage medium is used herein to refer to a computer-readable medium.

One aspect of this description relates to a method of designing an integrated circuit. The method comprises normalizing areas of one or more sub-components of one or more circuit components of an integrated circuit into ratio units, the ratio units being determined based on ratios of the areas of the one or more sub-components to a smallest area of the one or more sub-components. The method also comprises grouping the one or more sub-components into one or more groups based on an association between the one or more sub-components and one or more connections coupled to the one or more sub-components. The method further comprises determining a total ratio area per group of the one or more groups based on the ratio units of the sub-components included in the one or more groups.

The method additionally comprises identifying one or more of the one or more groups as a priority group based on a ranking of the one or more groups, the ranking being based on the total area per group. The method also comprises assigning, by a priority assignment process, a first color scheme or a second color scheme to the one or more sub-components included in the priority group. The method further comprises assigning, by an other assignment process, the first color scheme or the second color scheme to the remainder of the one or more sub-components. At least the other assignment process is based on a balancing of a first total area of sub-components having the first color scheme with a second total area of sub-components having the second color scheme.

Another aspect of this description relates to an apparatus comprising a processor, and at least one memory including computer program code for one or more programs. The at least one memory and the computer program code are configured to, with the processor, cause the apparatus to normalize areas of one or more sub-components of one or more circuit components of an integrated circuit into ratio units, the ratio units being determined based on ratios of the areas of the one or more sub-components to a smallest area of the one or more sub-components. The apparatus is also caused to group the one or more sub-components into one or more groups based on an association between the one or more sub-components and one or more connections coupled to the one or more sub-components. The apparatus is further caused to determine a total ratio area per group of the one or more groups based on the ratio units of the sub-components included in the one or more groups.

The apparatus is additionally caused to identify one or more of the one or more groups as a priority group based on a ranking of the one or more groups, the ranking being based on the total area per group. The apparatus is also caused to assign, by a priority assignment process, a first color scheme or a second color scheme to the one or more sub-components included in the priority group. The apparatus is further caused to assign, by an other assignment process, the first color scheme or the second color scheme to the remainder of the one or more sub-components. At least the other assignment process is based on a balancing of a first total area of sub-components having the first color scheme with a second total area of sub-components having the second color scheme.

Still another aspect of this description relates to non-transitory computer-readable storage medium carrying computer-readable instructions which, when executed by one or more processors, cause an apparatus to normalize areas of one or more sub-components of one or more circuit components of an integrated circuit into ratio units, the ratio units being determined based on ratios of the areas of the one or more sub-components to a smallest area of the one or more sub-components. The apparatus is also caused to group the one or more sub-components into one or more groups based on an association between the one or more sub-components and one or more connections coupled to the one or more sub-components. The apparatus is further caused to determine a total ratio area per group of the one or more groups based on the ratio units of the sub-components included in the one or more groups.

The apparatus is additionally caused to identify one or more of the one or more groups as a priority group based on a ranking of the one or more groups, the ranking being based on the total area per group. The apparatus is also caused to assign, by a priority assignment process, a first color scheme or a second color scheme to the one or more sub-components included in the priority group. The apparatus is further caused to assign, by an other assignment process, the first color scheme or the second color scheme to the remainder of the one or more sub-components. At least the other assignment process is based on a balancing of a first total area of sub-components having the first color scheme with a second total area of sub-components having the second color scheme.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    normalizing areas of one or more sub-components of one or more circuit components of an integrated circuit into ratio units, the ratio units being determined based on ratios of the areas of the one or more sub-components to a smallest area of the one or more sub-components, wherein the areas of the one or more sub-components are based on device parameters extracted from a schematic diagram of the integrated circuit, and the device parameters comprise a length, a width, or a quantity of a defined type of sub-components;
    grouping the one or more sub-components into one or more groups based on an association between the one or more sub-components and one or more connections coupled to the one or more sub-components;
    determining a total ratio area per group of the one or more groups based on the ratio units of the sub-components included in the one or more groups;
    identifying one or more of the one or more groups as a priority group based on a ranking of the one or more groups, the ranking being based on the total ratio area per group;
    assigning, by a priority assignment process, a first color scheme or a second color scheme to the one or more sub-components included in the priority group, wherein the first color scheme is associated with a first mask and the second color scheme is associated with a second mask;
    assigning, by an other assignment process, the first color scheme or the second color scheme to the remainder of the one or more sub-components, wherein at least the other assignment process is based on a balancing of a first total area of sub-components having the first color scheme with a second total area of sub-components having the second color scheme; and
    fabricating the integrated circuit using the first mask and the second mask based on the assigned first color scheme and the assigned second color scheme.

2. The method of claim 1, wherein one or more of the priority assignment process or the other assignment process is based on one or more design rules, the one or more design rules restricting use of one of the first mask or the second mask for generation of one or more of the one or more sub-components associated with the one or more design rules.

3. The method of claim 1, wherein the defined type of sub-component is one of a source, a drain, or a gate.

4. The method of claim 1, wherein the balancing of the first total area of sub-components having the first color scheme with the second total area of sub-components having the second color scheme is within a predetermined tolerance of the first total area of sub-components having the first color scheme being equal to the second total area of sub-components having the second color scheme.

5. The method of claim 1, further comprising:
    modifying the ranking of the one or more groups based on a pre-determined color scheme assignment of at least one of the one or more sub-components, the modification of the ranking causing one or more of the ranked groups to be newly identified as the priority group, and causing the ranking of the one or more groups to change based on the newly identified priority group,
    wherein the priority assignment process is associated with the newly identified priority group and the other assignment process is associated with the one or more sub-components other than the one or more sub-components included in the newly identified priority group.

6. The method of claim 1, wherein the other assignment process assigns the first color scheme or the second color scheme to the one or more sub-components other than the one or more sub-components included in the priority group based on the ranking order of the remaining groups other than the priority group.

7. The method of claim 1, wherein the color scheme assigned to the one or more sub-components included in the priority group is fixed based on the priority assignment process.

8. The method of claim 1, wherein one or more of the priority assignment process or the other assignment process comprises:
- dividing the ratio units into a quantity of tokens that represents a total ratio unit area of each of the one or more groups; and
- assigning one of the first color scheme or the second color scheme to a selected sub-component included in a selected group by assigning the first color scheme or the second color scheme to the selected sub-component by dropping a quantity of tokens representative of a total ratio unit area of the selected sub-component into a first color scheme bucket or a second color scheme bucket.

9. An apparatus comprising:
- a processor; and
- at least one memory including computer program code for one or more programs,
- the at least one memory and the computer program code configured to, with the processor, cause the apparatus to:
- normalize areas of one or more sub-components of one or more circuit components of an integrated circuit into ratio units, the ratio units being determined based on ratios of the areas of the one or more sub-components to a smallest area of the one or more sub-components, wherein the areas of the one or more sub-components are based on device parameters extracted from a schematic diagram of the integrated circuit, and the device parameters comprise a length, a width, or a quantity of a defined type of sub-components;
- group the one or more sub-components into one or more groups based on an association between the one or more sub-components and one or more connections coupled to the one or more sub-components;
- determine a total ratio area per group of the one or more groups based on the ratio units of the sub-components included in the one or more groups;
- identify one or more of the one or more groups as a priority group based on a ranking of the one or more groups, the ranking being based on the total ratio area per group;
- assign, by a priority assignment process, a first color scheme or a second color scheme to the one or more sub-components included in the priority group, wherein the first color scheme is associated with a first mask and the second color scheme is associated with a second mask;
- assign, by an other assignment process, the first color scheme or the second color scheme to the remainder of the one or more sub-components, wherein at least the other assignment process is based on a balancing of a first total area of sub-components having the first color scheme with a second total area of sub-components having the second color scheme; and
- output a layout for fabricating the integrated circuit using the first mask and the second mask based on the assigned first color scheme and the assigned second color scheme.

10. The apparatus of claim 9, wherein one or more of the priority assignment process or the other assignment process is based on one or more design rules, the one or more design rules restricting use of one of the first mask or the second mask for generation of one or more of the one or more sub-components associated with the one or more design rules.

11. The apparatus of claim 9, wherein the balancing of the first total area of sub-components having the first color scheme with the second total area of sub-components having the second color scheme is within a predetermined tolerance of the first total area of sub-components having the first color scheme being equal to the second total area of sub-components having the second color scheme.

12. The apparatus of claim 9, wherein the apparatus is further caused to:
- modify the ranking of the one or more groups based on a pre-determined color scheme assignment of at least one of the one or more sub-components, the modification of the ranking causing one or more of the ranked groups to be newly identified as the priority group, and causing the ranking of the one or more groups to be changed based on the newly identified priority group,
- wherein the priority assignment process is associated with the newly identified priority group and the other assignment process is associated with the one or more sub-components other than the one or more sub-components included in the newly identified priority group.

13. The apparatus of claim 9, wherein the other process assigns the first color scheme or the second color scheme to the one or more sub-components other than the one or more sub-components included in the priority group based on the ranking order of the remaining groups.

14. The apparatus of claim 9, wherein the color scheme assigned to the one or more sub-components included in the priority group is fixed based on the priority assignment process.

15. The apparatus of claim 9, wherein one or more of the priority assignment process or the other assignment process comprises:
- dividing the normalized ratio units into a quantity of tokens that represents the total ratio units of each of the one or more groups; and
- assigning one of the first color scheme or the second color scheme to a selected sub-component included in a selected group by assigning the first color scheme or the second color scheme to the selected sub-component by dropping a quantity of tokens representative of the total ratio unit area of the selected sub-component into a first color scheme bucket or a second color scheme bucket.

16. A non-transitory computer-readable storage medium carrying computer-readable instructions which, when executed by one or more processors, cause an apparatus to:
- normalize areas of one or more sub-components of one or more circuit components of an integrated circuit into ratio units, the ratio units being determined based on ratios of the areas of the one or more sub-components to a smallest area of the one or more sub-components, wherein the areas of the one or more sub-components are based on device parameters extracted from a schematic diagram of the integrated circuit, and the device parameters comprise a length, a width, or a quantity of a defined type of sub-components;
- group the one or more sub-components into one or more groups based on an association between the one or more sub-components and one or more connections coupled to the one or more sub-components;
- determine a total ratio area per group of the one or more groups based on the ratio units of the sub-components included in the one or more groups;
- identify one or more of the one or more groups as a priority group based on a ranking of the one or more groups, the ranking being based on the total ratio area per group;
- assign, by a priority assignment process, a first color scheme or a second color scheme to the one or more sub-components included in the priority group, wherein the first color scheme is associated with a first mask and the second color scheme is associated with a second mask;

assign, by an other assignment process, the first color scheme or the second color scheme to the remainder of the one or more sub-components, wherein at least the other assignment process is based on a balancing of a first total area of sub-components having the first color scheme with a second total area of sub-components having the second color scheme; and output a layout for fabricating the integrated circuit using the first mask and the second mask based on the assigned first color scheme and the assigned second color scheme.

17. The non-transitory computer-readable medium of claim 16, wherein the balancing of the first total area of sub-components having the first color scheme with the second total area of sub-components having the second color scheme is within a predetermined tolerance of the first total area of sub-components having the first color scheme being equal to the second total area of sub-components having the second color scheme.

18. The non-transitory computer-readable medium of claim 16, wherein the apparatus is further caused to:

modify the ranking of the one or more groups based on a pre-determined color scheme assignment of at least one of the one or more sub-components, the modification of the ranking causing one or more of the ranked groups to be newly identified as the priority group, and causing the ranking of the one or more groups to be changed based on the newly identified priority group.

19. The non-transitory computer-readable medium of claim 16, wherein the defined type of sub-component is one of a resistor, a transistor, a wire, a capacitor, a switch, a node, an interconnect, a via, a gate, a source, a drain, a doped region, or a channel.

20. The non-transitory computer-readable medium of claim 16, wherein to perform one or more of the priority assignment process or the other assignment process, the apparatus is caused to:

divide the ratio units into a quantity of tokens that represents a total ratio unit area of the one or more groups; and assign one of the first color scheme or the second color scheme to a selected sub-component included in a selected group by assigning the first color scheme or the second color scheme to the selected sub-component by dropping a quantity of tokens representative of a total ratio unit area of the selected sub-component into a first color scheme bucket or a second color scheme bucket.

* * * * *